United States Patent
Farinola et al.

(10) Patent No.: US 11,432,411 B2
(45) Date of Patent: Aug. 30, 2022

(54) DEVICE FOR ELECTRICALLY CONNECTING ONE OR MORE ELECTRICAL CONNECTORS TO A PRINTED CIRCUIT BOARD

(71) Applicant: TE Connectivity Italia Distribution S.r.l., Turin (IT)

(72) Inventors: Marcello Farinola, Turin (IT); Cinzia Alferi, Turin (IT); Arianna Spolverato, Turin (IT); Claudia Cezza, Turin (IT); Alessandro Genta, Turin (IT)

(73) Assignee: TE Connectivity Italia Distribution S.r.l., Turin (IT)

( * ) Notice: Subject to any disclaimer, the term of this patent is extended or adjusted under 35 U.S.C. 154(b) by 69 days.

(21) Appl. No.: 17/016,753

(22) Filed: Sep. 10, 2020

(65) Prior Publication Data

US 2021/0076509 A1 Mar. 11, 2021

(30) Foreign Application Priority Data

Sep. 10, 2019 (IT) .......................... 102019000015992

(51) Int. Cl.
*H01R 12/00* (2006.01)
*H05K 5/00* (2006.01)
(Continued)

(52) U.S. Cl.
CPC .............. *H05K 5/006* (2013.01); *B60L 53/00* (2019.02); *B60R 16/0239* (2013.01);
(Continued)

(58) Field of Classification Search
CPC ...... H05K 5/006; H05K 5/0069; B60L 53/00; B60R 16/0239; H01R 13/518;
(Continued)

(56) References Cited

U.S. PATENT DOCUMENTS

| 5,593,319 | A  | 1/1997  | Ohno et al. |
| 6,034,876 | A  | 3/2000  | Ohno et al. |
| 2012/0295469 | A1 | 11/2012 | Takeda et al. |

FOREIGN PATENT DOCUMENTS

JP    H10340755 A    12/1998

OTHER PUBLICATIONS

Extended European search report dated Nov. 9, 2020, in Appln. No. 20195091.2-1201, 16 pp.

(Continued)

*Primary Examiner* — Khiem M Nguyen
(74) *Attorney, Agent, or Firm* — Barley Snyder

(57) ABSTRACT

A device for connecting one or more electrical connectors to a printed circuit board includes a casing, a printed circuit board supported within the casing, and a miniaturized connector system. The miniaturized connector system includes a connector element mounted on a main side of the printed circuit board. The connector element includes a main body connected to the printed circuit board and defining a receptacle, and a metal terminal electrically connected to the printed circuit board. The metal terminal is arranged inside the receptacle and cooperates with a terminal of a cable. The miniaturized connector system includes an auxiliary portion of the main body arranged on an extension of the main body and defining an extension portion of the receptacle. The auxiliary portion is an integral part of a portion of the casing and has at least one seat receiving the printed circuit board and positioning the printed circuit board.

14 Claims, 7 Drawing Sheets

(51) Int. Cl.
  *B60L 53/00* (2019.01)
  *B60R 16/023* (2006.01)
  *H01R 13/518* (2006.01)
  *H01R 43/20* (2006.01)
  *H01R 12/57* (2011.01)
  *H01R 13/52* (2006.01)

(52) U.S. Cl.
  CPC ......... *H01R 13/518* (2013.01); *H01R 43/205* (2013.01); *H05K 5/0069* (2013.01); *H01R 12/57* (2013.01); *H01R 13/5219* (2013.01); *H01R 2201/26* (2013.01)

(58) Field of Classification Search
  CPC .. H01R 13/5219; H01R 12/57; H01R 43/205; H01R 2201/26
  USPC ..................................................... 439/76, 79
  See application file for complete search history.

(56) References Cited

OTHER PUBLICATIONS

Talian Search Report, dated Apr. 28, 2020, 14 pages.
Abstract for JP H10340755, dated Dec. 22, 1998, 1 page.

DEVICE FOR ELECTRICALLY CONNECTING ONE OR MORE ELECTRICAL CONNECTORS TO A PRINTED CIRCUIT BOARD

CROSS-REFERENCE TO RELATED APPLICATION

This application claims the benefit of the filing date under 35 U.S.C. § 119(a)-(d) of Italian Patent Application No. 102019000015992, filed on Sep. 10, 2019.

FIELD OF THE INVENTION

The present invention relates to a device for forming an electrical connection and, more particularly, to a device for electrically connecting one or more electrical connectors to a printed circuit board.

BACKGROUND

A device for electrically connecting one or more electrical connectors to a printed circuit board can have a complex and expensive structure requiring numerous components. Such a device can also be difficult to assemble and install on board a motor vehicle, and can be difficult to use and unreliable during use.

SUMMARY

A device for connecting one or more electrical connectors to a printed circuit board includes a casing, a printed circuit board supported within the casing, and a miniaturized connector system. The miniaturized connector system includes a connector element mounted on a main side of the printed circuit board. The connector element includes a main body connected to the printed circuit board and defining a receptacle, and a metal terminal electrically connected to the printed circuit board. The metal terminal is arranged inside the receptacle and cooperates with a terminal of a cable. The miniaturized connector system includes an auxiliary portion of the main body arranged on an extension of the main body and defining an extension portion of the receptacle. The auxiliary portion is an integral part of a portion of the casing and has at least one seat receiving the printed circuit board and positioning the printed circuit board.

BRIEF DESCRIPTION OF THE DRAWINGS

The invention will now be described by way of example with reference to the accompanying Figures, of which.

DETAILED DESCRIPTION OF THE EMBODIMENT(S)

In the following description, various specific details are illustrated aimed at a thorough understanding of examples of one or more embodiments. The embodiments can be implemented without one or more of the specific details, or with other methods, components, materials, etc. In other cases, known structures, materials, or operations are not shown or described in detail to avoid obscuring various aspects of the embodiments.

The reference to "an embodiment" in the context of this description indicates that a particular configuration, structure or characteristic described in relation to the embodiment is included in at least one embodiment. Therefore, phrases such as "in an embodiment", possibly present in different places of this description do not necessarily refer to the same embodiment. Moreover, particular conformations, structures or characteristics can be combined in a suitable manner in one or more embodiments and/or associated with the embodiments in a different way from that illustrated here, for example, a characteristic here exemplified in relation to a figure may be applied to one or more embodiments exemplified in a different figure. The references illustrated here are only for convenience and do not therefore delimit the field of protection or the scope of the embodiments.

In the attached drawings, the reference D indicates—in its entirety—an embodiment of a device for electrically connecting one or more electrical connectors to a printed circuit board P.

Figure 1:
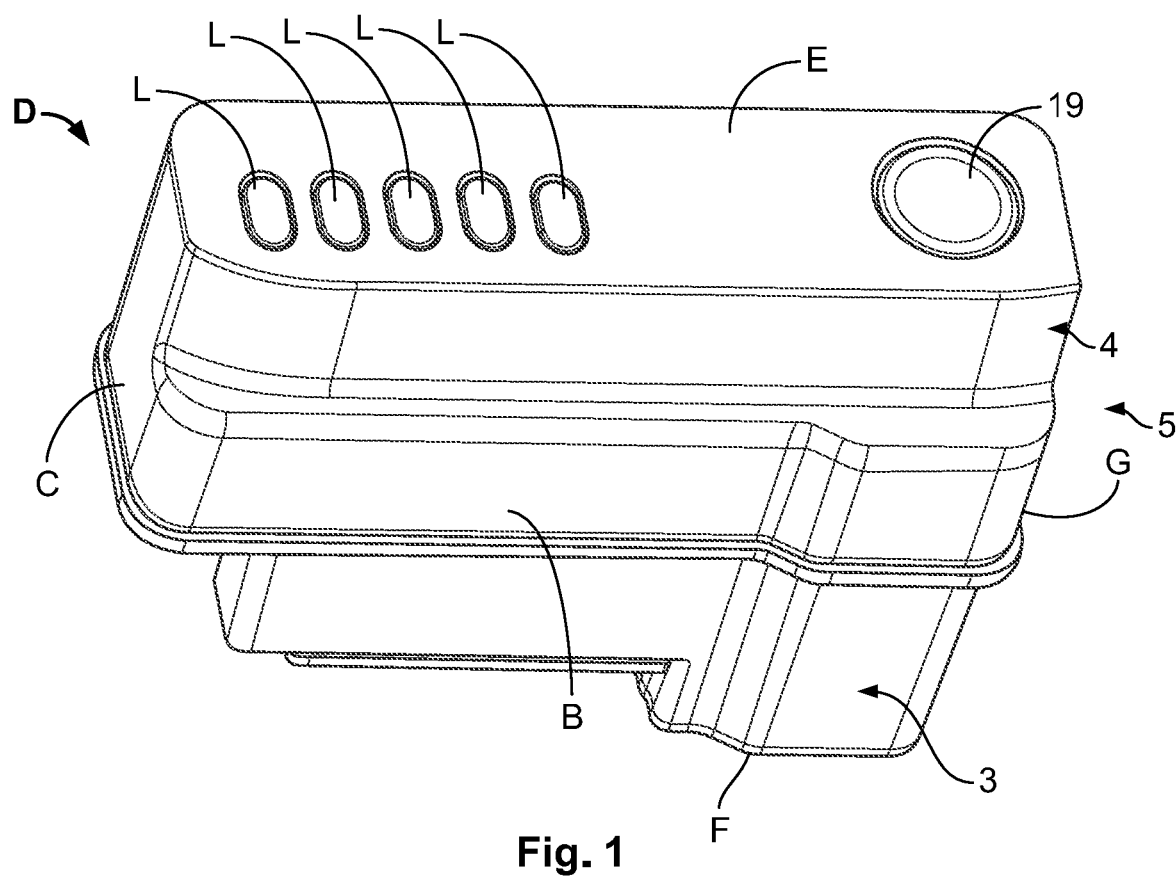
FIG. 1 is a perspective view of a device according to an embodiment.
Figure 2:
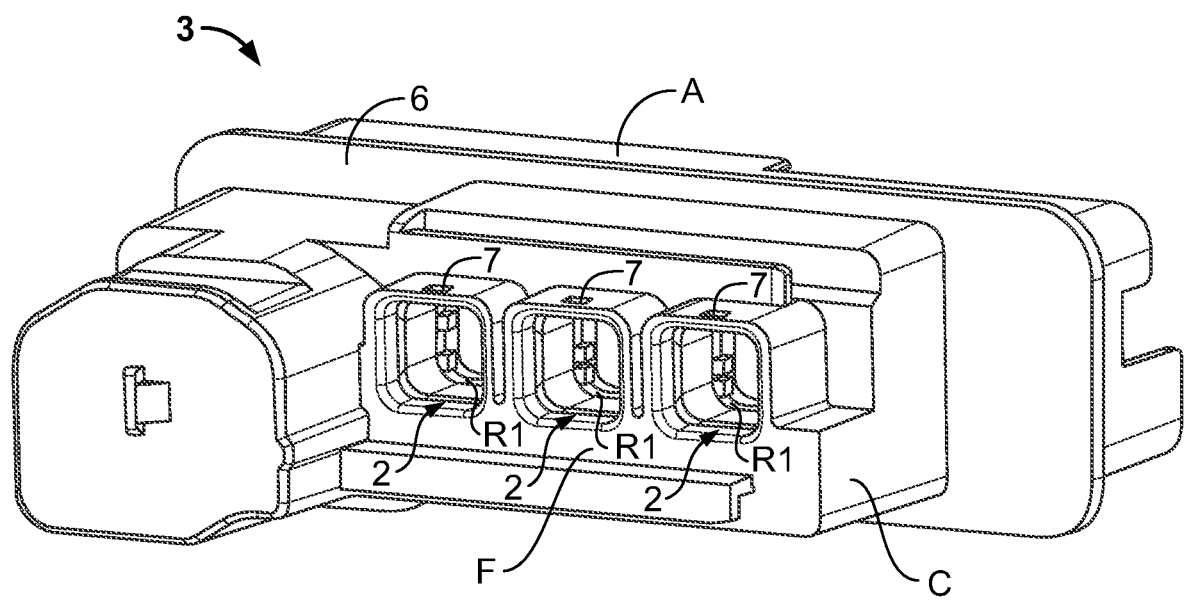
FIG. 2 is a perspective view of a portion of the device.

As shown in FIGS. 1 and 2, the device D has a casing 5 of a substantially prismatic shape, which defines an upper wall A, a lower wall B, opposite side walls C, G, a front wall E and a rear wall F.

Figure 5:
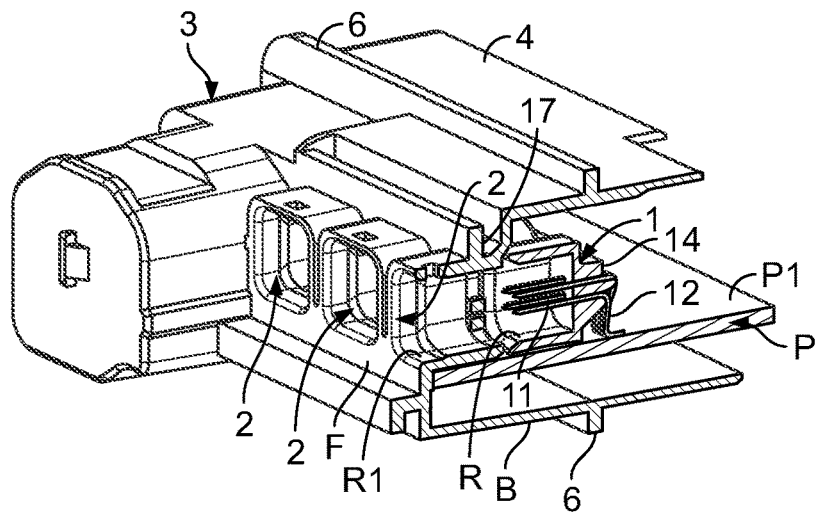
FIG. 5 is a sectional perspective view of the miniaturized connector system.
Figure 6:
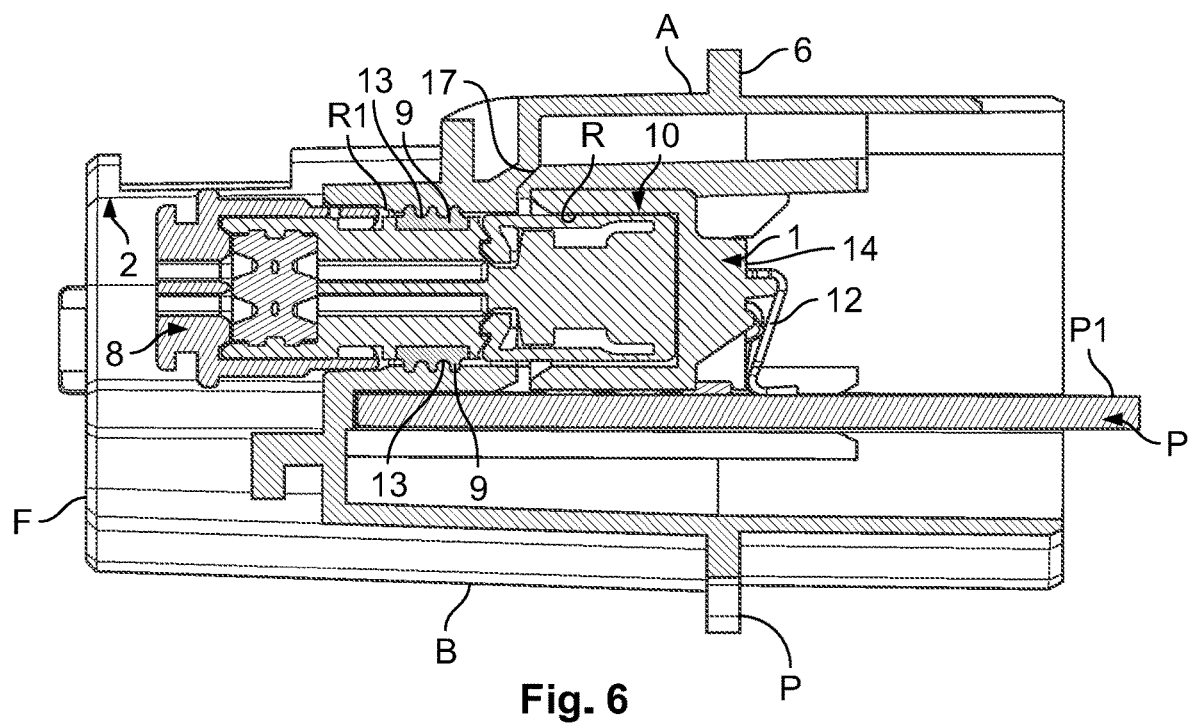
FIG. 6 is a sectional side view of the miniaturized connector system with the terminal of the cable.
Figure 7:
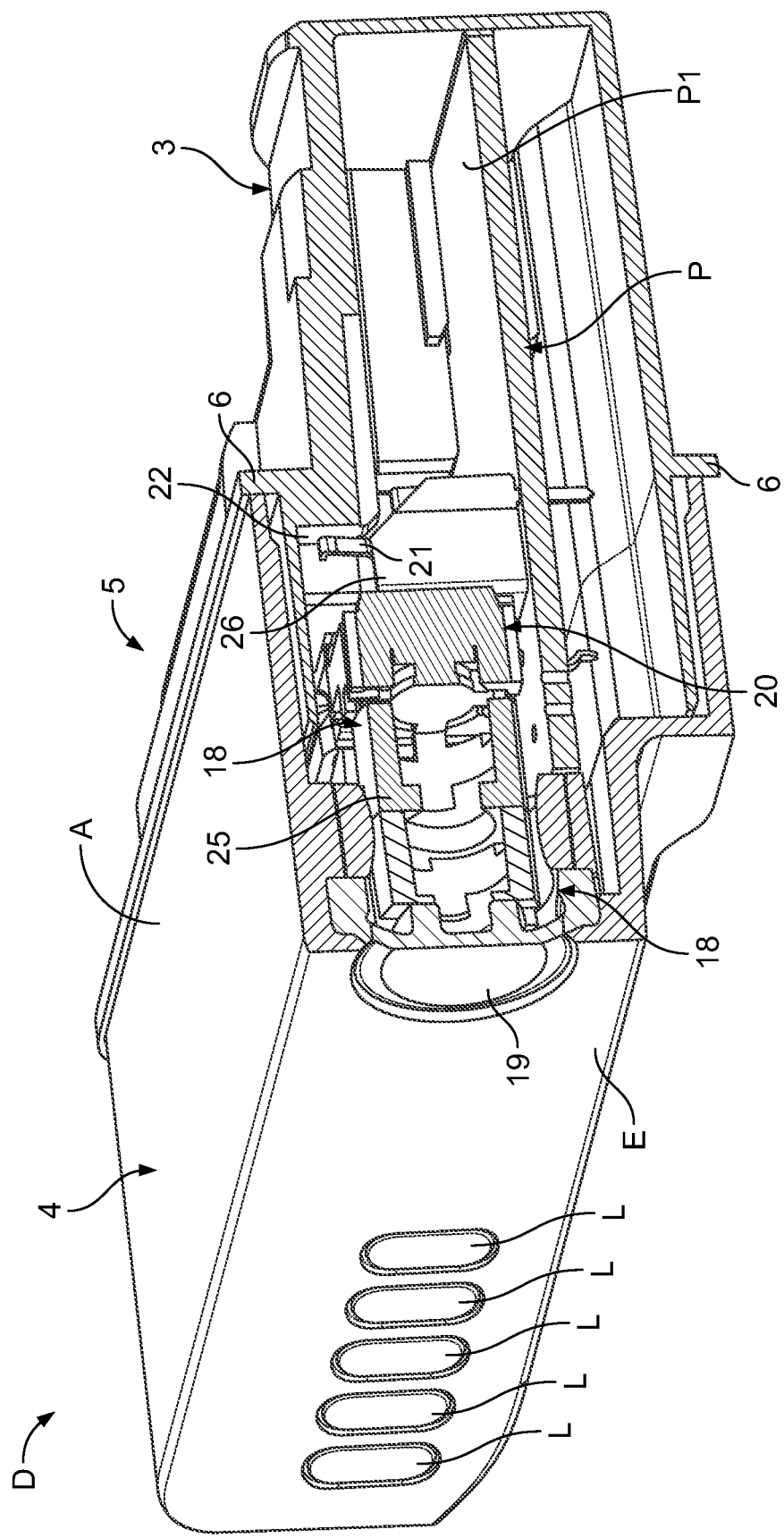
FIG. 7 is a sectional perspective view of the device.

A printed circuit board P is mounted inside the casing 5, the board P having a main side P1 on which a plurality of components are mounted, as shown in FIGS. 5-7. Details relating to these components are described below. In the shown embodiment, the printed circuit board P is supported within the casing 5 along a horizontal direction, perpendicular to the front wall E.

As shown in FIG. 1, the casing 5 of the device D is defined by a first support body 3, configured to support the printed circuit board P, and a second support body 4, bearing the front wall E with a push-button 19. The first and the second support bodies 3,4 are rigidly connected to each other, so as to create the casing 5. In an embodiment, the first and second support bodies 3,4 are welded together by a laser welding process.

The first support body 3, as shown in FIGS. 2-8, has a thickness 6 protruding from the upper wall A, lower wall B and side walls C, G of the first support body 3, along a direction perpendicular thereto, arranged to be joined to a corresponding front surface of the second support body 4, so as to create a single hollow casing 5 inside which all the components of the device D are arranged. Of course, the casing 5 can be made according to other construction techniques, materials and conformations, which differ from that indicated above, without departing from the scope of the present invention.

Figure 3:
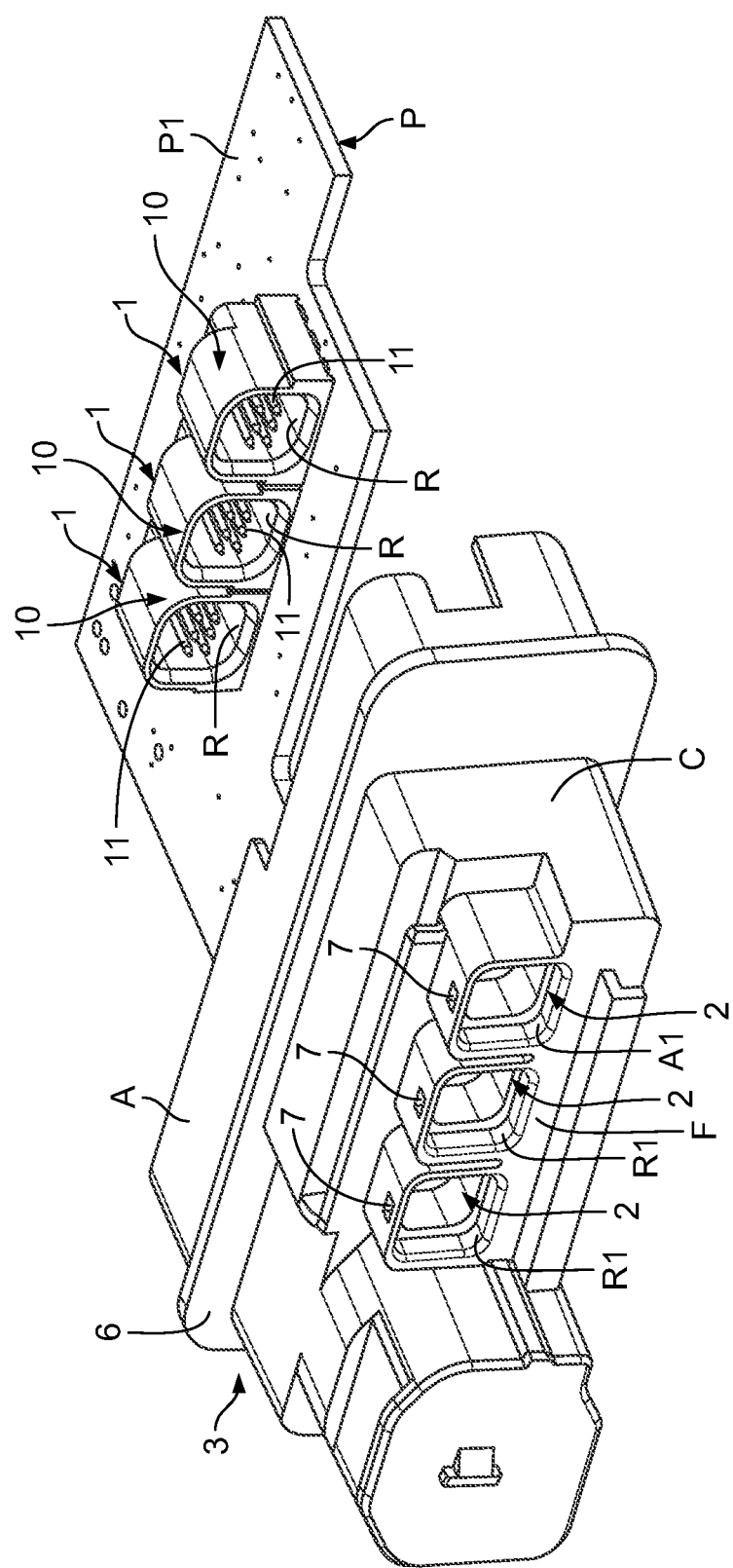
FIG. 3 is an exploded perspective view of a miniaturized connector system according to an embodiment.
Figure 4:
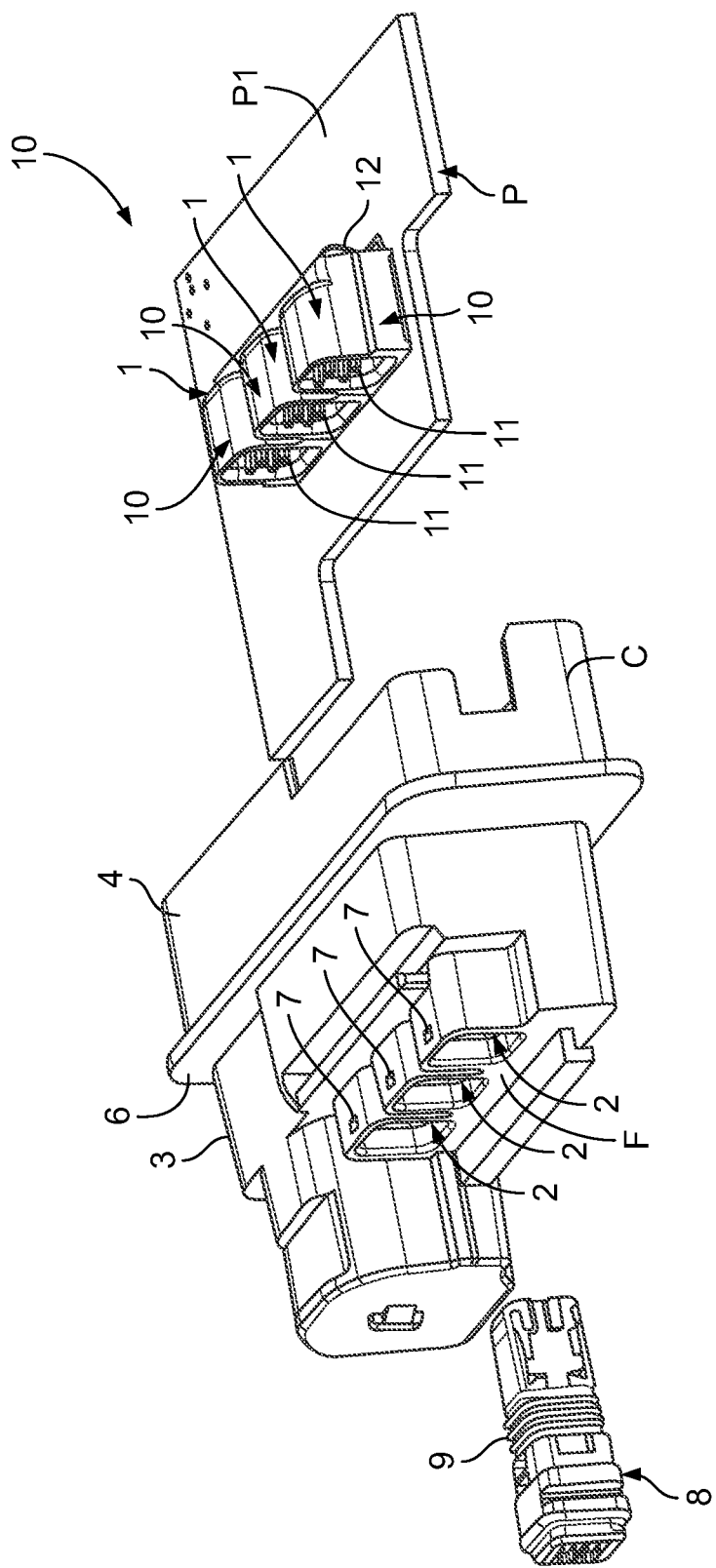
FIG. 4 is an exploded perspective view of the miniaturized connector system with a terminal of a cable.

In an embodiment, the device D for electrical connection to a printed circuit board P includes a miniaturized connector system. As shown in FIGS. 3 and 4, the miniaturized connector system includes one or more connector elements 1 mounted on the printed circuit board P. The connector element 1 can be welded or glued on the main side P1 of the board P.

As shown in FIGS. 3 and 4, the connector element 1, rigidly connected to the printed circuit board P, comprises a main connector body 10 made of plastic material, which defines a receptacle R extending along a direction substantially parallel to the main plane of the printed circuit board P. In one or more embodiments, the main body 10 of the connector 1 can be cuboid-shaped, so as to define a bottom wall 14 of the receptacle R, substantially perpendicular to the main plane of the printed circuit board P, shown in FIGS. 5 and 6. The connector element 1 has at least one metal terminal 11 arranged at least partially inside the receptacle R, and electrically connected to the printed circuit board P. The metal terminals 11 are configured to cooperate with a terminal of a cable 8, shown in FIGS. 4 and 6, connected to the connector element 1 and arranged within the receptacle R, according to an operative connection direction parallel to the main plane of the printed circuit board P.

As shown in FIGS. 5 and 6, the metal terminals 11 each include a respective portion 12 protruding from the connector element 1. The portion 12 protrudes from respective holes made on a bottom surface 14 of the receptacle R. In order to make the electrical connection with the printed circuit board P, the aforesaid protruding portions 12 are bent in the direction of the printed circuit board P and welded thereto, at its main side P1.

The miniaturized connector system, as shown in FIGS. 5 and 6, also includes an auxiliary portion 2 of the body 10 of the connector element 1, arranged on the extension of the main body 10 of the connector element 1. The auxiliary portion 2 defines an extension portion R1 of the receptacle R of the connector element 1. In an embodiment, the auxiliary portion 2 of the connector element 1 is an integral part of a portion of the casing 5, separate from the main body 10 of the connector element 1. This portion of the casing 5 also includes at least one seat within which the printed circuit board P is received, in such a way as to bring the printed circuit board P into position relative to the aforesaid portion of the casing 5 and to the auxiliary portion 2. The details relating to the way in which the printed circuit board P is locked within the casing 5 are described below.

As shown in FIGS. 2-5, the auxiliary portion 2 is an integral part of the first support body 3, which supports the printed circuit board P, and is obtained at the rear wall F of the casing 5. As previously indicated, the printed circuit board P is arranged within the casing 5 along a horizontal direction, substantially perpendicular to the front E and rear F walls of the casing 5.

As shown in FIGS. 4 and 6, a terminal 2 of an electric cable may be connected to the printed circuit board P by the miniaturized connector system including the connector element 1 carrying the metal terminals 11 and the auxiliary portion 2, which defines an extension R1 of the receptacle R. To allow locking of the terminal 8 within the receptacle R and its extension R1, the auxiliary portions 2 have respective openings 7 configured to cooperate with a locking element of the terminal 8. The cross-sectional view of FIG. 6 illustrates the terminal 8 connected to the metal terminals 11 and to the board P, and arranged inside the receptacle R and its extension R1.

As shown in FIGS. 4 and 6, a sealing area 13 is formed at the inner surface of the auxiliary portion 2. The sealing area 13 has a profile configured to cooperate with an annular sealing gasket 9 arranged on the cable terminal 8. Due to this characteristic, it is possible to make a sealed electrical connection, to avoid water infiltrations that could damage the metal terminals 11 of the connector element 1, or other electronic components, compromising the overall operation of the device D. In order to achieve this function effectively, the sealing area 13 is arranged downstream (in the direction of the rear wall F of the casing 5) with respect to the terminals 11 carried by the main body 10 of the connector element 1.

In order to provide simple and intuitive assembly operations for making the device D, the casing 5 of the device D has an abutment surface 17, against which, in the assembled condition of the device D, the connector element 1 abuts as shown in FIGS. 5 and 6. The abutment surface 17 allows the auxiliary portion 2 of the extension R1 of the receptacle R, and the receptacle R of the main body 10 of the connector element 1 to be correctly aligned easily. In the shown embodiment, the abutment surface 17 is defined by a wall arranged within the first support body 3, protruding and extending perpendicularly to the upper wall A of the casing 5, in order to abut against a front portion of the body 10 of plastic material of the connector element 1, opposite the bottom wall 14 of the receptacle R.

In an embodiment, the device D including the miniaturized connector system described above is a device for controlling and/or supplying information about a recharging operation of an electric motor vehicle or a hybrid motor vehicle, which can be mounted on the motor vehicle and associable with an inlet electric connector assembly for recharging the motor vehicle.

In this embodiment, the device D also comprises a human-machine interface HMI associated with the casing 5, to allow a user to control the recharging process of the battery pack of the motor vehicle, on which the device D is installed. The interface includes a push-button switching device 18 comprising an on/off button 19, as shown in FIGS. 1 and 7. In the shown embodiment, the on/off button 19 is arranged at the front wall E. With the push-button 19, it is also possible to create a series of auxiliary functions, in addition to the switching on and off of the device D, such as programming the start time of the recharging step. Again, with reference to the example of FIG. 1, on the front wall E, next to the push-button 19, there are a plurality of warning lights L, which light up progressively during recharging of the motor vehicle, to display the battery recharge status of the motor vehicle. Of course, the configuration of the interface illustrated in the attached drawings, in particular in FIG. 1, is given here purely by way of example.

Figure 8:
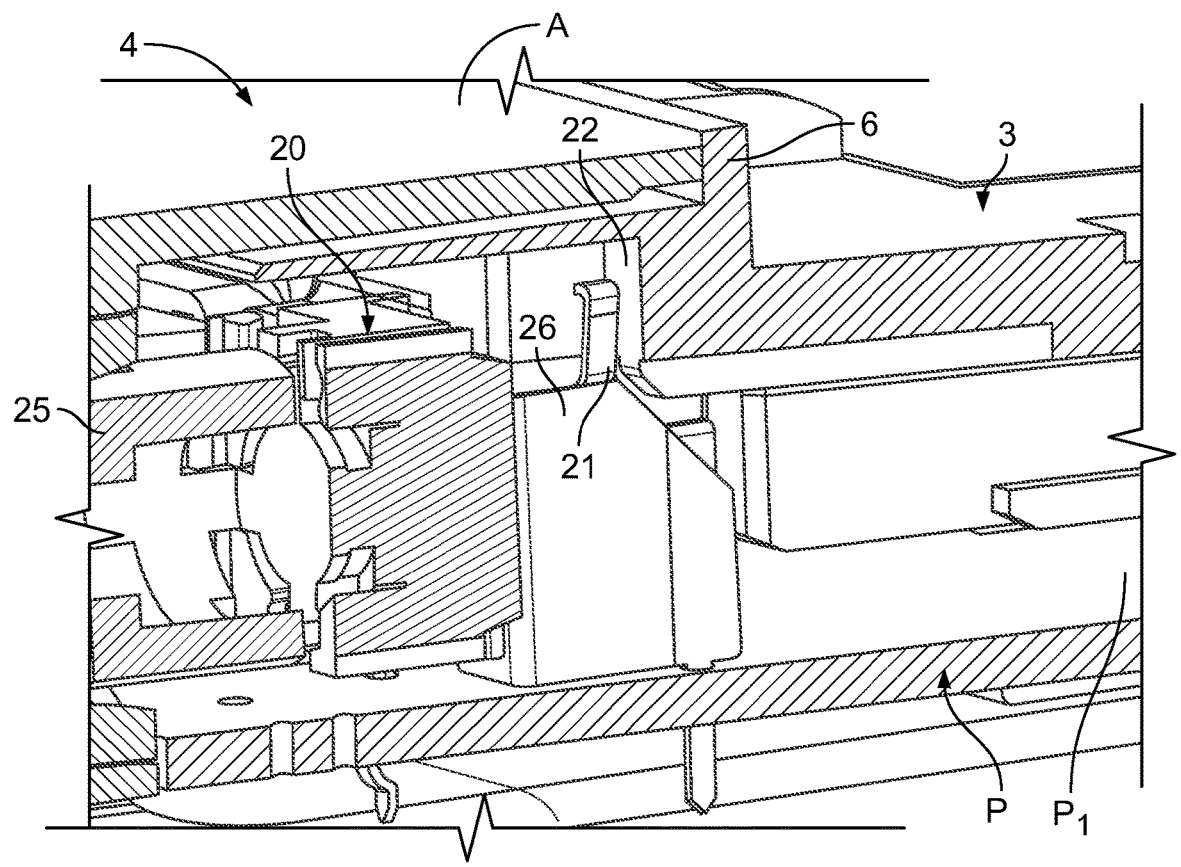
FIG. 8 is a detail view of a portion of FIG. 7.

The human-machine interface HMI includes, in addition to the push-button 19, a push-button body 20 arranged inside the casing 5, as shown in FIG. 7. The push-button body 20 has at least one portion mounted on the printed circuit board P, and carries at least one electrical contact for transmitting a pulse to the printed circuit board P, so as to activate the device D. In an embodiment, the push-button body 20 has a tubular-shaped first portion 25 made of plastic material, having a first end connected to the push-button 19. As shown in FIGS. 7 and 8, the push-button body 20 also has a second portion 26 of conductive material, having a first end connected to the tubular portion 25 of plastic material, and a second end welded to the printed circuit board P.

Following the pushing of the on/off button 19, the push-button body 20 moves along an operating direction corresponding to the main axis of the push-button body 20, to transmit a pulse which, through the electrical terminals 11, activates the device D. The second portion 26 is mounted on the board P so as to allow micro-displacements of the push-button body 20 deriving from the pressure of the push-button 19. The push-button body 20 also has an elastic element that allows the push-button body 20 to be returned to its initial position.

As shown in FIGS. 7 and 8, push-button switching device 18 has an arm 21 protruding from the push-button body 20 which, in a pressed push-button condition, abuts against an abutment wall 22 arranged inside the casing 5. In the shown embodiment, the abutment wall 22 is formed within the first support body 3, and is spaced apart perpendicularly to the main axis of the push-button body 20.

The stress deriving from the pressure of the push-button 19 and the displacement of the push-button body 20 is discharged onto the abutment wall 22 by the arm 21, thus preventing this stress from being discharged or transferred onto the printed circuit board P. It will, therefore, be appreciated that the device D is made in such a way as to avoid damage to the printed circuit board P, deriving from an excessive pressure on the push-button 19.

In an embodiment, as shown in FIGS. 7 and 8, the printed circuit board P is mounted inside the casing 5 along a horizontal direction, in such a way that the main plane of the board P is perpendicular to the front and rear walls E, F of the casing 5. The push-button body 20 extends within the casing 5 perpendicularly to the front and rear walls E, F of the casing 5, near the main side P1 of the board P. The arm 21 protrudes from the push-button body 20, more particularly from the portion 26 of conductive material, in the opposite direction with respect to the printed circuit board P, perpendicularly to the main axis of the push-button body 20. The arm 21 has a main plane substantially perpendicular to the abutment wall 22, in such a way that, in the pressed condition of the push-button 19, one side of the arm 21 is arranged against the abutment wall 22, which is arranged perpendicularly to the main axis of the push-button body 20.

The casing 5 includes therein a plurality of grooves S1, S2, S3, S4, to lock the printed circuit board P in position within the casing 5, as shown in FIGS. 9-13. In the shown embodiment the board P is locked horizontally, in such a way that its main plane is perpendicular to the front and rear walls E, F of the casing 5. The casing 5 of the device D is defined by a first support body 3, configured to support the printed circuit board P, and a second support body 4, bearing the front wall E with the push-button 19.

Figure 9:
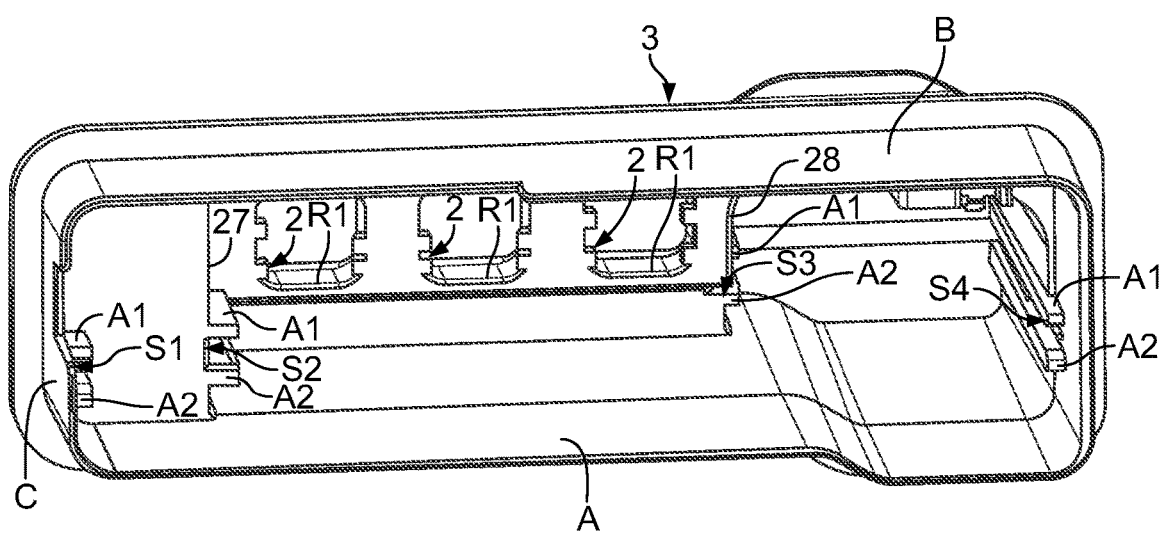
FIG. 9 is a perspective view of the portion of the device.
Figure 10:
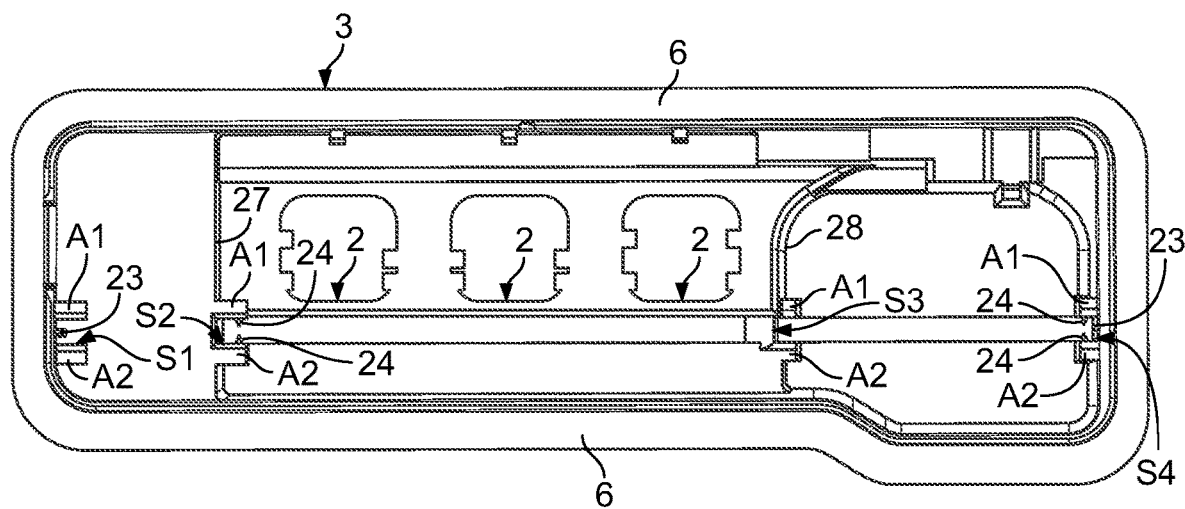
FIG. 10 is a front view of the portion of the device.

FIGS. 9 and 10 illustrate, respectively, a perspective view and a front view of the first support body 3 carrying the grooves S1, S2, S3, S4, to lock the printed circuit board P in place. In an embodiment, each groove is defined by a pair of fins including an upper fin A1 and a lower fin A2, spaced apart vertically from each other, to retain, respectively, a portion of the printed circuit board P. In the shown embodiment, the main side P1 of the printed circuit board P is in contact with the upper fins A1, while the secondary side of the printed circuit board P is in contact with the lower fins A2.

The plurality of grooves includes two end grooves S1, S4, each arranged at the inner surface of a respective side wall C, G of the casing 5, and two intermediate grooves S2, S3, each arranged at a respective intermediate wall 27,28, formed within said casing 5 between said side walls C, G, as shown in FIGS. 9 and 10. In the shown embodiment, the intermediate walls 27,28 are substantially parallel to the side walls C, G of the casing 5. In the shown embodiment, the intermediate grooves S2,S3 are both facing one of the two end grooves S1, S4, and arranged in positions progressively closer to the rear wall F of the casing 5.

Figure 11:
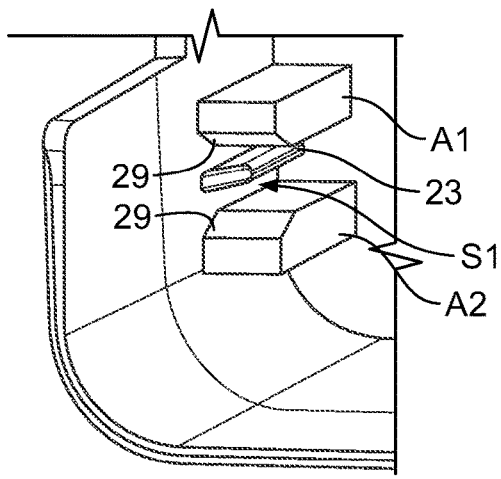
FIG. 11 is a detail perspective view of the portion of the device.

As shown in FIGS. 10-13, a central rib 23 is formed between the upper fin A1 and lower fin A2, defining the end grooves S1, S4, which extends longitudinally within the respective end groove S1, S4. The central ribs 23 are arranged to limit the movement of the printed circuit board P along a horizontal direction, perpendicular to the side walls C, G of the casing 5. As shown in FIG. 11, the upper and lower fins A1, A2, which define the outer grooves S1, S4 have a front beveled portion 29 configured for facilitating the insertion of the printed circuit board P within the grooves.

Figure 12:
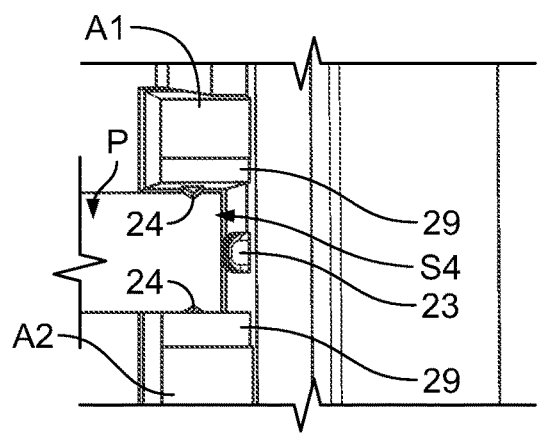
FIG. 12 is another detail perspective view of the portion of the device.
Figure 13:
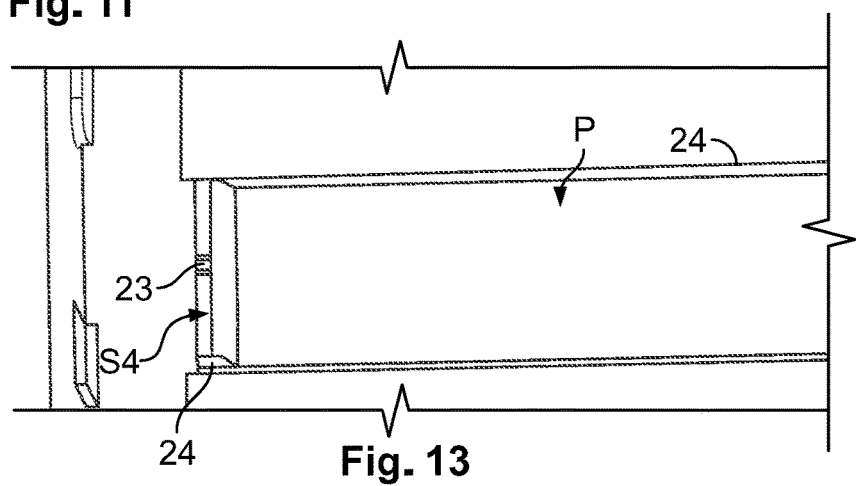
FIG. 13 is another detail perspective view of the portion of the device.

As shown in FIGS. 10, 12, and 13, between the upper and lower fins A1, A2, defining one of the outer grooves S4, and between the upper and lower fins A1, A2, defining one of the intermediate grooves S2, two triangular ribs 24 are formed, facing each other and each arranged adjacent to a respective upper and lower fin A1, A2, to limit the movement of the printed circuit board P along a direction perpendicular to the front wall E of the casing 5.

Due to the grooves S1, S2, S3, S4, the printed circuit board P is stably locked inside the casing 5, avoiding the risk of running into operating anomalies of any type (for example, detachment of the board P from its seats inside the casing, caused by vibrations deriving from the operating steps of a motor vehicle on which the device is installed).

In an embodiment, three connector elements 1 are arranged side-by-side with respect to each other, respectively welded to the main side P1 of the printed circuit board P, with the respective receptacle R extending along directions parallel to the main plane of the printed circuit board P. At the rear wall F, a set of three auxiliary portions 2 of the connector elements 1 are formed, each arranged on the extension of a respective main body 10 of the connector element 1. In this embodiment example, a set of three terminals 8 of electric cables will be connected to the respective connector elements 1 to make a connection with an electronic control unit, with an actuator for locking a mobile recharging connector, mounted on board the motor vehicle with which the present device D is associated and, finally, with a fixed recharging connector.

It will also be appreciated that characteristics or details exemplified with reference to one of the figures described above can also be transposed (individually or in combination with each other) to embodiments exemplified in different figures.

The device D has a relatively simple and low-cost structure, designed to reduce the number of components to be produced and assembled, has a compact structure which allows integration of a miniaturized connector system therein, can be assembled and installed on board a motor vehicle with simple and rapid operations, allows a sealed electrical connection to be obtained, to avoid water infiltration, with a limited number of components, and is simple to use and reliable during use.

As previously indicated, one or more embodiments may relate to a device D for recharging an electric motor vehicle or a hybrid motor vehicle which can be mounted on board a motor vehicle.

The present invention also relates to a method for assembling a device for connecting one or more electrical connectors to a printed circuit board, comprising the following steps:

providing a printed circuit board P having a main side P1, rigidly connecting at least one connector element 1 comprising a main connector body 10 made of plastic material, and defining a receptacle R extending along a direction substantially parallel to the main plane of the printed circuit board P, said at least one connector element 1 also comprising at least one metal terminal 11, connecting said at least one metal terminal 11 to the printed circuit board P, providing an auxiliary portion 2 of the main body 10 of the connector element 1, integrated in a portion of the casing 5, separated from said main body 10 of the connector element 1 defining said receptacle R, locking said printed circuit board P into a seat formed on said portion of the casing 5, and arranging said main body 10 of the connector element 1 in abutment against an abutment surface 17 of said portion 3 of the casing 5, connecting a terminal 8 of a cable to the connector element 1, through said auxiliary portion 2, according to an operative connection direction, parallel to the main plane of the printed circuit board P.

Of course, without prejudice to the principle of the invention, the details of construction and the embodiments may vary widely with respect to those described and illustrated purely by way of example, without departing from the scope of the present invention.

What is claimed is:

1. A device for connecting one or more electrical connectors to a printed circuit board, comprising:
    a casing;
    a printed circuit board supported within the casing; and
    a miniaturized connector system including:
        a connector element mounted on a main side of the printed circuit board, the connector element including:
            a main body made of a plastic material, rigidly connected to the printed circuit board, and defining a receptacle extending along a direction substantially parallel to a main plane of the printed circuit board; and
            a metal terminal electrically connected to the printed circuit board, arranged inside the receptacle, and configured to cooperate with a terminal of a cable according to an operating connection direction parallel to the main plane; and
        an auxiliary portion of the main body arranged on an extension of the main body and defining an extension portion of the receptacle, the auxiliary portion is an integral part of a portion of the casing having a plurality of grooves to lock the printed circuit board within the casing, each groove defined by a pair of fins.

2. The device of claim 1, wherein the metal terminal has a protruding portion protruding from the main body through holes in a bottom wall of the receptacle.

3. The device of claim 2, wherein the protruding portion is bent in a direction of the printed circuit board and welded to the printed circuit board.

4. The device of claim 2, wherein a sealing area is defined on an inner surface of the auxiliary portion and cooperates with an annular sealing gasket arranged on a cable terminal connectable to the metal terminal within the receptacle.

5. The device of claim 4, wherein the sealing area is arranged downstream, in an opposite direction from the bottom wall of the receptacle, with respect to the metal terminal carried by the main body.

6. The device of claim 2, wherein the portion of the casing has an abutment surface against which the connector element abuts in an assembled condition.

7. The device of claim 6, wherein the abutment surface is defined by a wall arranged within the casing.

8. The device of claim 7, wherein the wall protrudes and extends perpendicularly to the main plane of the printed circuit board and abuts against a front portion of the connector element opposite to the bottom wall of the receptacle.

9. The device of claim 1, wherein a set of three connector elements is rigidly connected to the main side of the printed circuit board and is associated with a set of three auxiliary portions.

10. The device of claim 9, wherein the three connector elements are arranged side-by-side to provide an electrical connection with a plurality of components that can be mounted on a motor vehicle.

11. The device of claim 1, wherein the auxiliary portion has an opening arranged close to the extension portion of the receptacle.

12. The device of claim 11, wherein the opening is configured to cooperate with a locking element of a cable terminal to lock the cable terminal within the receptacle and the extension portion.

13. The device of claim 1, wherein the device is for recharging an electric motor vehicle or a hybrid motor vehicle, and is mountable on the motor vehicle.

14. A method for assembling a device for connecting one or more electrical connectors to a printed circuit board, comprising:
    providing a printed circuit board having a main side;
    rigidly connecting at least one connector element including a main body made of a plastic material and defining a receptacle extending along a direction substantially parallel to a main plane of the printed circuit board, the at least one connector element having a metal terminal;
    connecting the metal terminal to the printed circuit board;
    providing an auxiliary portion of the main body integrated in a portion of a casing and separated from the main body;
    locking the printed circuit board into a plurality of grooves in the portion of the casing, each groove is defined by a pair of fins;
    arranging the main body in abutment with an abutment surface of the portion of the casing; and
    connecting a terminal of a cable to the connector element through the auxiliary portion according to an operative connection direction parallel to the main plane of the printed circuit board.

* * * * *